US011700547B2

(12) United States Patent
Lee et al.

(10) Patent No.: US 11,700,547 B2
(45) Date of Patent: Jul. 11, 2023

(54) METHOD AND DEVICE FOR TRANSMITTING/RECEIVING SIGNAL IN WIRELESS COMMUNICATION SYSTEM

(71) Applicant: Samsung Electronics Co., Ltd., Suwon-si (KR)

(72) Inventors: Joohyun Lee, Suwon-si (KR); Hayoung Yang, Suwon-si (KR); Soongyoon Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 23 days.

(21) Appl. No.: 16/960,702

(22) PCT Filed: Jan. 17, 2019

(86) PCT No.: PCT/KR2019/000701
§ 371 (c)(1),
(2) Date: Jul. 8, 2020

(87) PCT Pub. No.: WO2019/143149
PCT Pub. Date: Jul. 25, 2019

(65) Prior Publication Data
US 2020/0359261 A1    Nov. 12, 2020

(30) Foreign Application Priority Data
Jan. 17, 2018   (KR) ........................ 10-2018-0006268

(51) Int. Cl.
*H04W 28/06* (2009.01)
*H04W 24/10* (2009.01)
(Continued)

(52) U.S. Cl.
CPC .......... *H04W 28/06* (2013.01); *H04W 24/10* (2013.01); *H04W 72/0446* (2013.01); *H04W 72/0453* (2013.01)

(58) Field of Classification Search
None
See application file for complete search history.

(56) References Cited

U.S. PATENT DOCUMENTS

| 7,436,758 B2 | 10/2008 | Suh et al. |
| 9,467,199 B1 | 10/2016 | Maiden et al. |

(Continued)

FOREIGN PATENT DOCUMENTS

| KR | 10-2005-0040058 A | 5/2005 |
| WO | 2017/041270 A1 | 3/2017 |

OTHER PUBLICATIONS

Nokia Bell Labs, A unified formulation of segment companding laws and synthesis of codecs and digital compandors, Sep. 7, 1970, DOI: 10.1002/j.1538-7305.1970.tb01843.x, Print ISSN: 0005-8580.
(Continued)

*Primary Examiner* — Chi H Pham
*Assistant Examiner* — Raul Rivas
(74) *Attorney, Agent, or Firm* — Jefferson IP Law, LLP

(57) ABSTRACT

A radio frequency (RF) unit, a digital unit, and methods of transmitting and receiving data in a wireless communication system are provided. The digital unit may include: a transceiver configured to receive compressed data from an RF unit, a processor configured to divide a frequency domain and a time domain into a plurality of blocks, set a compression parameter to be applied to each of the plurality of blocks, and expand the received data in units of the blocks based on the set compression parameter, and a memory storing the compression parameter.

10 Claims, 11 Drawing Sheets

(51) Int. Cl.
H04W 72/0446 (2023.01)
H04W 72/0453 (2023.01)

(56) References Cited

U.S. PATENT DOCUMENTS

| | | | |
|---|---|---|---|
| 9,553,954 B1 | 1/2017 | Akhter et al. | |
| 2005/0088960 A1* | 4/2005 | Suh | H04L 5/026 370/335 |
| 2009/0081967 A1* | 3/2009 | Imamura | H04W 48/20 455/101 |
| 2012/0170481 A1* | 7/2012 | Kimura | H04B 7/15542 370/252 |
| 2015/0156284 A1 | 6/2015 | Akhter et al. | |
| 2015/0221310 A1* | 8/2015 | Abe | G10L 19/02 704/500 |
| 2015/0372728 A1 | 12/2015 | Rahman et al. | |
| 2018/0013597 A1 | 1/2018 | Barbieri et al. | |
| 2018/0287673 A1* | 10/2018 | Chang | H04L 25/0224 |
| 2019/0349126 A1* | 11/2019 | Andgart | H04L 1/0013 |

OTHER PUBLICATIONS

International Search Report dated Apr. 26, 2019, issued in International Application No. PCT/KR2019/000701.
Korean Office Action dated Jun. 27, 2022, issued in Korean Patent Application No. 10-2018-0006268.

\* cited by examiner

FIG. 10

| INDEX | ADDITIONAL SCHEDULING INFORMATION | COMPRESSION PARAMETER |
|---|---|---|
| | MEASUREMENT REGION | |
| 0 | | INPUT SCALING: 1, COMPRESSION RATIO: 1/2, CHARACTERISTIC VALUE: 255 |
| 1 | MSC<$A_1$, MIMO layer=$B_1$, SNR <$C_1$ | INPUT SCALING: $I_1$, COMPRESSION RATIO: $R_1$, CHARACTERISTIC VALUE: $M_1$ |
| 2 | MSC<$A_2$, MIMO layer=$B_2$, SNR <$C_2$ | INPUT SCALING: $I_2$, COMPRESSION RATIO: $R_2$, CHARACTERISTIC VALUE: $M_2$ |
| 3 | MSC<$A_3$, MIMO layer=$B_3$, SNR <$C_3$ | INPUT SCALING: $I_3$, COMPRESSION RATIO: $R_3$, CHARACTERISTIC VALUE: $M_3$ |
| ... | ... | ... |

1001

METHOD AND DEVICE FOR TRANSMITTING/RECEIVING SIGNAL IN WIRELESS COMMUNICATION SYSTEM

TECHNICAL FIELD

The present disclosure relates to a wireless communication system, and more particularly, to methods and devices for transmitting and receiving signals in a wireless communication system.

BACKGROUND ART

A base station supporting a wireless communication system may include a digital unit (DU) processing baseband signals and a radio frequency (RF) unit (or radio unit) (RU) processing analog radio signals of an RF band. The base station may include one or more digital units and one or more RF units.

As the number of transmission/reception antennas has increased as in virtual LAN and full-dimensional MIMO (FD-MIMO), the data transmission amount between an RF unit and a digital unit has rapidly increased. The RF unit and the digital unit may transmit data by using a separate interface protocol. However, because the bandwidth of a channel used to transmit data by using an interface protocol is limited, various methods of compressing data are used to reduce the data transmission amount.

In the case of a wireless communication system based on Orthogonal Frequency Division Multiplexing/Single Carrier Frequency Division Multiple Access (OFDM/SC-FDMA), it may be disadvantageous in terms of the data transmission amount because an overhead such as a cyclic prefix (CP) or a guard band signal is added to a time-domain signal. Thus, in order for an RF unit to effectively transmit data to a digital unit, it may be advantageous in terms of the transmission amount to transmit a frequency-domain signal without an overhead. Accordingly, recently, a method by which an RF unit performs a Fast Fourier Transform (FFT)/Inverse Fast Fourier Transform (IFFT) operation for conversion between the time domain and the frequency domain and transmits frequency-domain data to a digital unit has been discussed.

DESCRIPTION OF EMBODIMENTS

Technical Problem

Various embodiments described herein provide a device and method capable of reducing the amount of data transmitted between a digital unit and a radio frequency (RF) unit by efficiently compressing data transmitted between the digital unit and the RF unit.

Solution to Problem

According to various embodiments, a radio frequency (RF) unit, a digital unit, and a method of transmitting and receiving data in a wireless communication system are provided.

According to an embodiment, a digital unit includes: a transceiver configured to receive compressed data from an RF unit; a processor configured to divide a frequency domain and a time domain into a plurality of blocks, set a compression parameter applied to each of the plurality of blocks, and expand the received data in units of the blocks based on the set compression parameter; and a memory storing the compression parameter.

BRIEF DESCRIPTION OF DRAWINGS

FIG. 10 is a diagram illustrating a mapping relationship between additional scheduling information and compression parameters, according to an embodiment.

BEST MODE

Figure 1:
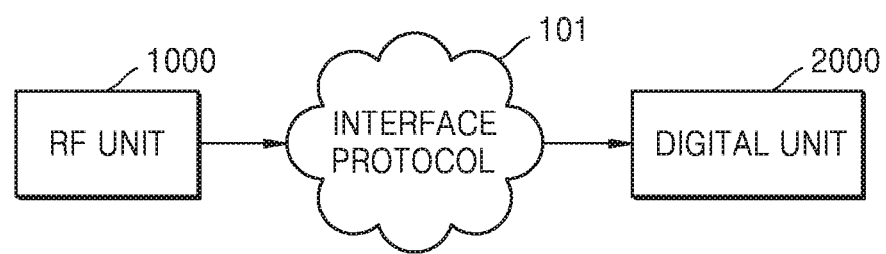
FIG. 1 is a diagram illustrating an example in which a radio frequency (RF) unit and a digital unit transmit and receive data, according to an embodiment.

According to an embodiment, a digital unit includes: a transceiver configured to receive compressed data from a radio frequency (RF) unit; a processor configured to divide a frequency domain and a time domain into a plurality of blocks, set a compression parameter to be applied to each of the plurality of blocks, and expand the received data in units of the blocks based on the set compression parameter; and a memory storing the compression parameter.

According to an embodiment, the processor may be further configured to measure a characteristic of a signal in each of the plurality of blocks and set the compression parameter to be applied to each of the plurality of blocks based on the measured characteristic of the signal.

According to an embodiment, the plurality of blocks may be blocks divided into a preset number of symbol units with respect to the time domain, and the processor may be further configured to set a region corresponding to a first symbol in each of the plurality of blocks as a measurement section and measure a characteristic of a signal in the measurement section.

According to an embodiment, the processor may be further configured to expand data corresponding to the measurement section based on a prestored compression parameter.

According to an embodiment, the processor may be further configured to set a compression parameter to be applied to a remaining section other than the measurement section in each of the plurality of blocks based on the measured characteristic of the signal.

According to an embodiment, the processor may be further configured to set the compression parameter to be applied to each of the plurality of blocks based on scheduling information shared between the digital unit and the RF unit.

According to an embodiment, the plurality of blocks may be determined based on the scheduling information.

According to an embodiment, the processor may be further configured to measure a characteristic of a signal in each of the plurality of blocks and set the compression parameter to be applied to each of the plurality of blocks based on the measured characteristic of the signal.

According to an embodiment, the scheduling information may include at least one of a position of an allocated resource, a bandwidth, and a scheduling period.

According to an embodiment, an RF unit includes: a processor configured to divide a frequency domain and a time domain into a plurality of blocks, set a compression parameter to be applied to each of the plurality of blocks, and compress data of the frequency domain corresponding to each of the plurality of blocks based on the set compression parameter; a memory storing the compression parameter; and a transceiver processor configured to transmit the compressed data of the frequency domain to a digital unit.

According to an embodiment, a method, performed by a digital unit, of transmitting and receiving data includes: receiving compressed data from an RF unit; dividing a frequency domain and a time domain into a plurality of blocks, setting a compression parameter to be applied to each of the plurality of blocks; and expanding the received data in units of the blocks based on the set compression parameter.

According to an embodiment, a method, performed by an RF unit, of transmitting and receiving data includes: dividing a frequency domain and a time domain into a plurality of blocks; setting a compression parameter to be applied to each of the plurality of blocks; compressing data corresponding to each of the plurality of blocks based on the set compression parameter; and transmitting the compressed data to a digital unit.

Mode of Disclosure

Hereinafter, embodiments of the present disclosure will be described in detail with reference to the accompanying drawings so that those of ordinary skill in the art may easily implement the embodiments of the present disclosure. However, the present disclosure may be embodied in many different forms and should not be construed as being limited to the embodiments set forth herein. Also, portions irrelevant to the description of the present disclosure will be omitted in the drawings for a clear description of the present disclosure, and like reference numerals will denote like elements throughout the specification.

The terms used herein are those general terms currently widely used in the art in consideration of functions in regard to the present disclosure, but the terms may mean various other terms according to the intentions of those of ordinary skill in the art, precedents, or new technology in the art. Thus, the terms used herein should not be interpreted only by the names of the terms but should be interpreted based on the meanings of the terms and the contents throughout the present disclosure.

Also, the terms used herein are only used to describe particular embodiments and are not intended to limit the present disclosure. As used herein, the singular forms "a", "an", and "the" are intended to include the plural forms as well, unless the context clearly indicates otherwise. Also, throughout the specification, when an element is referred to as being "connected" to another element, it may be "directly connected" to the other element or may be "electrically connected" to the other element with one or more intervening elements therebetween. Also, when something is referred to as "including" a component, another component may be further included unless specified otherwise.

As used herein particularly in the claims, "the" or the like may refer to both the singular and the plural. Also, when there is no description explicitly specifying the order of operations described in a method according to the present disclosure, the described operations may be performed in a suitable order. The scope of the present disclosure is not limited to the described operation order.

The phrases "in some embodiments" or "in an embodiment" appearing in various places in the specification may not necessarily all refer to the same embodiment.

Also, the connection lines or connection members between the components illustrated in the drawings are merely examples of functional connections and/or physical or logical connections. In an actual device, the connections between components may be represented by various functional connections, physical connections, or logical connections that are replaceable or added.

Hereinafter, the present disclosure will be described in detail with reference to the accompanying drawings.

FIG. 1 is a diagram illustrating an example in which an RF unit and a digital unit transmit and receive signals, according to an embodiment.

In a wireless communication system, a base station may include an RF unit for processing radio frequency band signals and a digital unit for processing baseband signals. The RF unit and the digital unit may be installed in the same place or may be separately installed in different places. In order to satisfy users' demands for higher data transmission rates and higher service qualities, the number of base stations operated has gradually increased. Also, considering the expandability of the base station and the operation of the base station, a structure in which the RF unit and the digital unit are separately installed in different places has been generalized.

As the RF unit and the digital unit are separated from each other, a method for transmitting and receiving data between the RF unit and the digital unit is required. As illustrated in FIG. 1, when an RF unit 1000 and a digital unit 2000 are installed separately from each other, the RF unit 1000 and the digital unit 2000 may be connected through an optical cable and may communicate by using an interface protocol 101. For example, the RF unit 1000 and the digital unit 2000 may transmit and receive data by using the interface protocol 101 such as Common Public Radio Interface (CPRI), Open Baseband Remote Radiohead Interface (OBSAI), and Open Radio Interface (ORI); however, the present disclosure is not limited thereto. The data transmitted between the RF unit 1000 and the digital unit 2000 may be in-phase/quadrature (I/Q) sample data but is not limited thereto.

According to an embodiment, the RF unit 1000 may compress data and transmit the compressed data to the digital unit 2000 in order to reduce the amount of data transmitted to the digital unit 2000. When the compressed data is transmitted to the digital unit 2000, the digital unit 2000 may decompress the compressed data by using an expansion method corresponding to a compression method used by the RF unit 1000.

Figure 2:
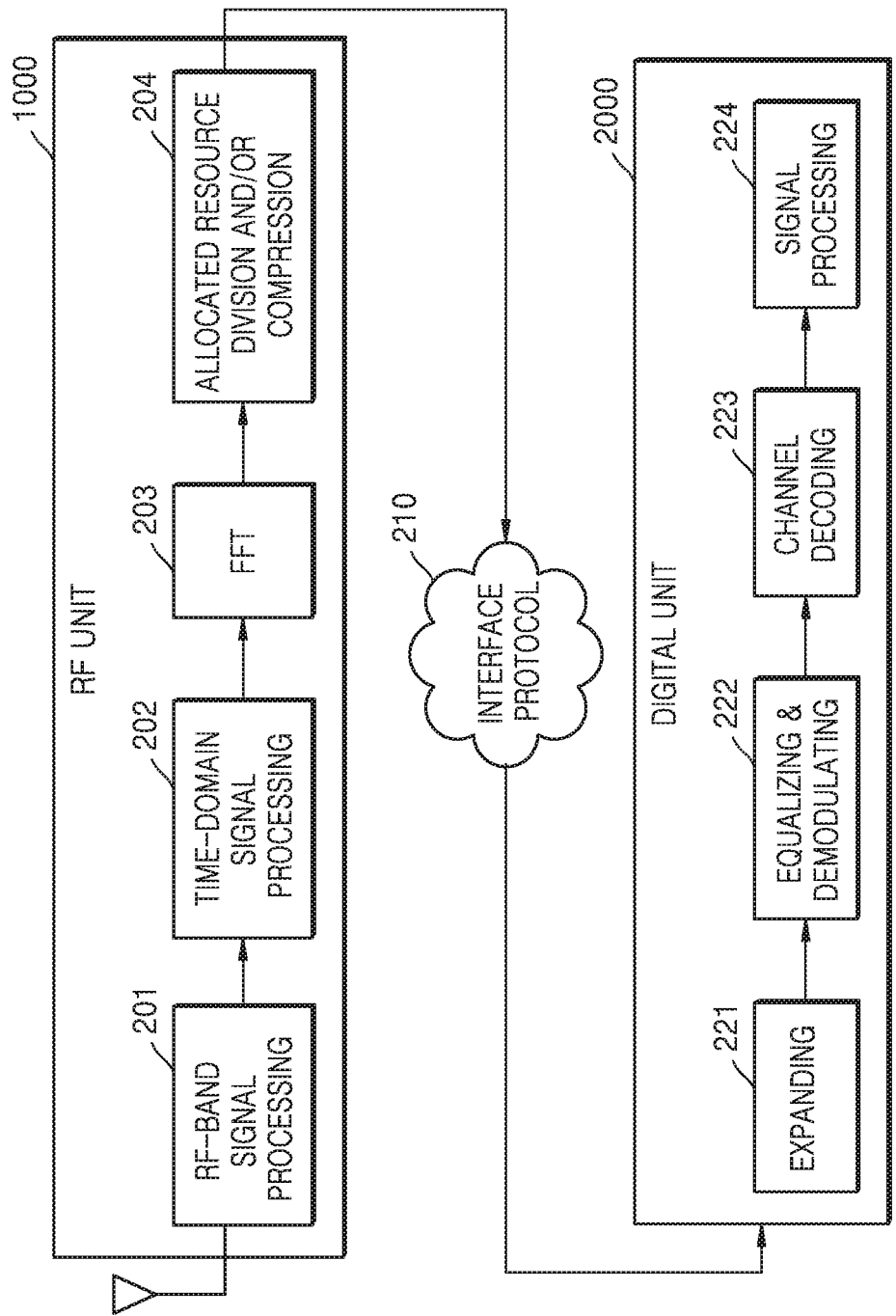
FIG. 2 is a diagram illustrating a process by which an RF unit and a digital unit transmit and receive data, according to an embodiment.

FIG. 2 is a diagram illustrating a process of transmitting and receiving data by an RF unit and a digital unit, according to an embodiment.

Referring to FIG. 2, the RF unit 1000 according to an embodiment may perform certain signal processing 201 on an RF signal received through an antenna. Accordingly, the RF signal may be converted into baseband time-domain data. In this case, the time-domain data may mean I/Q sample data of the time domain but is not limited thereto.

Also, the RF unit 2000 may convert time-domain data into frequency-domain data by performing time-domain signal processing 202 and Fast Fourier Transform (FFT) 203 on the time-domain data. The RF unit 1000 may transmit the frequency-domain data to the digital unit 2000 and may compress and transmit the frequency-domain data in order to reduce the amount of data transmitted between the RF unit 1000 and the digital unit 2000. In this case, the RF unit 1000 may divide an allocated resource and compress the frequency-domain data (204).

When the compressed frequency-domain data is transmitted, the digital unit 2000 according to an embodiment may expand the compressed frequency-domain data by using the expansion method corresponding to the compression method used in the RF unit 1000 (221). The digital unit 2000 may perform equalizing and demodulation on the expanded signal (222). Also, the digital unit 2000 may perform channel decoding on the demodulated signal (223) and may further perform certain signal processing on the decoded signal (224).

As described above, when the RF unit 1000 compresses the frequency-domain data, a frequency-domain signal characteristic may be assumed in advance and a compression parameter may be set considering the assumed signal characteristic. For example, the compression parameter may include at least one of the compression method, the size of an input data and an output data, the compression ratio, and the characteristic value according to the compression method. Also, the compression parameter may include the frequency information used in Huffman coding, the A value used in the A-law compression method, and the mu value used in the Mu-law compression method, but is limited thereto.

Also, according to an embodiment, the RF unit 1000 may set the compression parameter without considering the signal characteristic. However, when the compression method and the compression parameter are set by considering the pre-assumed signal characteristic or without considering the signal characteristic, it may be difficult to reduce the performance loss due to the compression transmission after the compression parameter is set.

In the case of a broadband mobile communication system, the entire frequency band may be divided into a plurality of frequency blocks and allocated through a scheduler. Thus, in the case of a frequency-domain signal, the signal characteristic (e.g., the average signal power or the maximum/minimum power) may vary according to the allocated frequency bands. Also, it may be unnecessary to transmit a signal of an unallocated frequency band in a partial region of the frequency domain. Thus, in order to more efficiently transmit and receive the frequency-domain data between the RF unit 1000 and the digital unit 2000, a method of adjusting the compression parameter based on the signal characteristic of each frequency region or scheduling information and compressing the frequency-domain data based on the adjusted compression parameter may be required.

However, when the compression parameter is adjusted, the digital unit 2000 should also know the adjusted compression parameter in order to restore the I/Q sample data received from the RF unit 1000. Thus, when the compression parameter is adjusted in the RF unit 1000, a process of additionally transmitting information about the adjusted compression parameter to the digital unit 2000 may be required.

In order to solve the above problem, the RF unit 1000 and the digital unit 2000 according to an embodiment may preset a combination of compression parameters corresponding to the scheduling information and the compression parameters of the RF unit 1000 and the digital unit 2000 may be synchronized based on the scheduling information. Also, according to an embodiment, the RF unit 1000 and the digital unit 2000 may divide the frequency domain and the time domain into a plurality of blocks and measure the characteristic of a signal in a portion of each of the plurality of blocks. Also, by setting the compression parameters based on the measured signal characteristics, the RF unit 1000 and the digital unit 2000 may compress and transmit data in block units without having to additionally transmit information.

Figure 3:
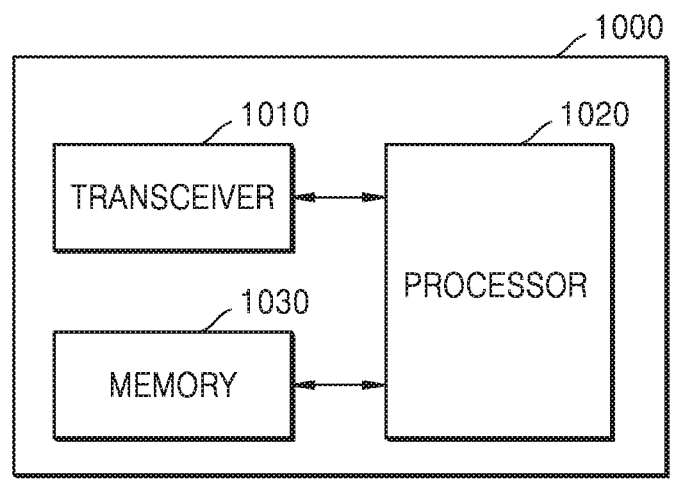
FIG. 3 is a block diagram illustrating a configuration of an RF unit according to an embodiment.

FIG. 3 is a block diagram illustrating a configuration of an RF unit according to an embodiment.

Referring to FIG. 3, the RF unit 1000 may include a transceiver 1010, a processor 1020, and a memory 1030. However, the components of the RF unit 1000 according to an embodiment are not limited thereto. According to embodiments, the RF unit 1000 may include more components or fewer components than the above components. In addition, according to embodiments, in the RF unit 1000, the transceiver 1010, the processor 1020, and the memory 1030 may be implemented as a single chip.

The transceiver 1010 may output the RF signal received through a radio channel to the processor 1020 and transmit the frequency-domain data output from the processor 1020 to the digital unit 2000 through an optical cable. Also, according to an embodiment, the transceiver 1010 may transmit the data compressed in block units by the processor 1020 to the digital unit 2000.

The processor 1020 may control an overall operation of the RF unit 1000.

According to an embodiment, the processor 1020 may divide the frequency domain and the time domain into a plurality of blocks. The plurality of blocks may mean blocks divided into a preset number of symbol units with respect to the time domain, and for example, the symbols may mean OFDM/SC-FDMA symbols; however, the present disclosure is not limited thereto. Also, the plurality of blocks may be determined based on the scheduling information shared between the RF unit 1000 and the digital unit 2000.

According to an embodiment, the processor 1020 may set a compression parameter to be applied to each of the plurality of blocks. The compression parameter may include at least one of the compression method, the size of an input data and an output data, the compression ratio, and the characteristic value according to the compression method. Also, the compression parameter may include the frequency information used in Huffman coding, the A value used in the A-law compression method, and the mu value used in the Mu-law compression method, but is limited thereto.

The processor 1020 may measure the characteristic of a signal in each of the plurality of blocks and set the compression parameter to be applied to each of the plurality of blocks based on the measured signal characteristic. For example, the processor 1020 may set a region corresponding to a first symbol in each of the plurality of blocks as a measurement section and measure the characteristic of a signal in the measurement section.

The compression parameter to be applied to the measurement section may be a compression parameter pre-shared between the RF unit 1000 and the digital unit 2000, and the compression parameter to be applied to the remaining section other than the measurement section in each of the plurality of blocks may be set based on the measure signal characteristic.

Also, according to an embodiment, the processor 1020 may set the compression parameter to be applied to each of the plurality of blocks based on the scheduling information shared between the RF unit 1000 and the digital unit 2000. The scheduling information may include at least one of the allocated resource position, the bandwidth, and the scheduling period but is not limited thereto.

According to an embodiment, the processor 1020 may compress data corresponding to each of the plurality of blocks based on the set compression parameter. For example, the data corresponding to each of the plurality of blocks may be compressed based on different compression parameters. The processor 1020 may set the compression parameter considering the scheduling information or the signal characteristic in each of the plurality of blocks and apply different compression parameters to the respective blocks. Accordingly, the processor 1020 may more efficiently transmit the frequency-domain signal to the digital unit 2000.

According to an embodiment, the memory 1030 may store the compression parameter set by the processor 1020. Also, the memory 1030 may store the schedule information shared between the RF unit 1000 and the digital unit 2000. The memory 1030 may be configured in various forms such as ROM or/and RAM or/and hard disk or/and CD-ROM or/and DVD.

Figure 4:
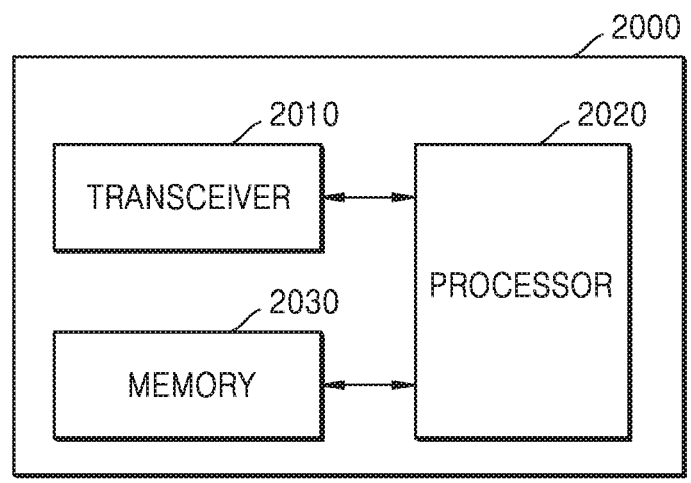
FIG. 4 is a block diagram illustrating a configuration of a digital unit according to an embodiment.

FIG. 4 is a block diagram illustrating a configuration of a digital unit according to an embodiment.

Referring to FIG. 4, the digital unit 2000 may include a transceiver 2010, a processor 2020, and a memory 2030. However, the components of the digital unit 2000 according to an embodiment are not limited thereto. According to embodiments, the digital unit 2000 may include more components or fewer components than the above components. In addition, according to embodiments, in the digital unit 2000, the transceiver 2010, the processor 2020, and the memory 2030 may be implemented as a single chip.

According to an embodiment, the transceiver 2010 may receive a compressed frequency-domain signal from the RF unit 1000 and may transmit the received signal to the processor 2020.

The processor 2020 may control an overall operation of the digital unit 2000.

According to an embodiment, the processor 2020 may divide the frequency domain and the time domain into a plurality of blocks. The plurality of blocks may be blocks divided into a preset number of symbol units with respect to the time domain, and for example, the symbols may mean OFDM/SC-FDMA symbols; however, the present disclosure is not limited thereto. The plurality of blocks may be determined based on the scheduling information shared between the digital unit 2000 and the RF unit 1000.

According to an embodiment, the processor 2020 may set a compression parameter to be applied to each of the plurality of blocks. The processor 2020 may measure the characteristic of a signal in each of the plurality of blocks and set the compression parameter to be applied to each of the plurality of blocks based on the measured signal characteristic. For example, the processor 2020 may set a region corresponding to a first symbol in each of the plurality of blocks as a measurement section and measure the characteristic of a signal in the measurement section. In this case, the measurement section may mean a section set in the same manner as the RF unit 1000.

The compression parameter to be applied to the measurement section may be a compression parameter prestored in the digital unit 2000 and the RF unit 1000, and the compression parameter to be applied to the remaining section other than the measurement section in each of the plurality of blocks may be set based on the measure signal characteristic.

Also, according to an embodiment, the processor 2020 may set the compression parameter to be applied to each of the plurality of blocks based on the scheduling information shared between the digital unit 2000 and the RF unit 1000. The scheduling information may include at least one of the allocated resource position, the bandwidth, and the scheduling period but is not limited thereto.

According to an embodiment, the processor 2020 may expand the compressed data in block units based on the set compression parameter.

According to an embodiment, the memory 2030 may store the compression parameter set by the processor 2020. Also, the memory 2030 may store the schedule information shared between the digital unit 2000 and the RF unit 1000. The memory 2030 may be configured in various forms such as ROM or/and RAM or/and hard disk or/and CD-ROM or/and DVD.

Figure 5:
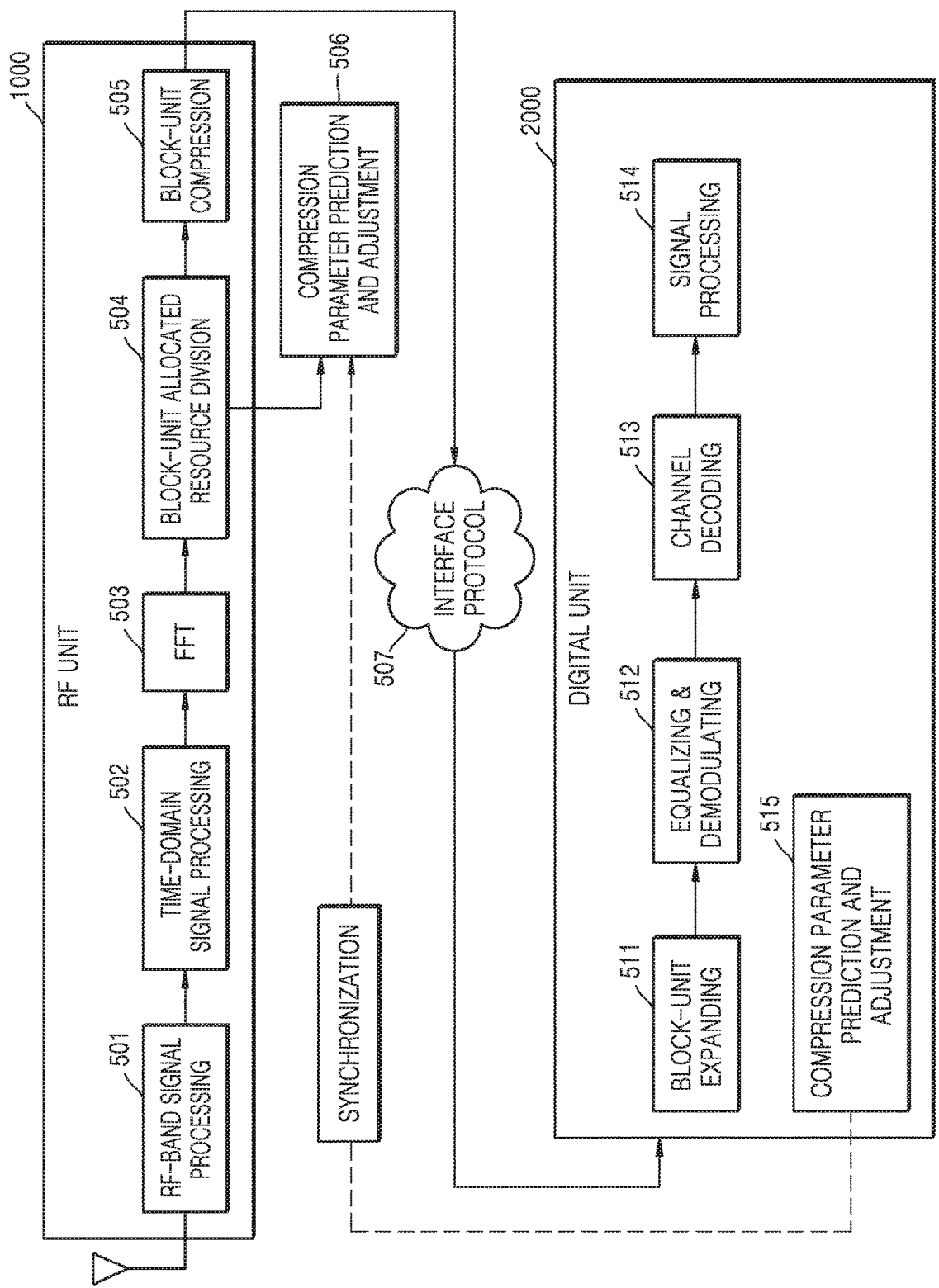
FIG. 5 is a diagram illustrating a process by which an RF unit and a digital unit transmit and receive data, according to an embodiment.

FIG. 5 is a diagram illustrating a process of transmitting and receiving data by an RF unit and a digital unit, according to an embodiment.

Referring to FIG. 5, the RF unit 1000 according to an embodiment may perform certain signal processing on the RF signal received through an antenna to convert the same into baseband time-domain data (501). Also, the RF unit 1000 may convert time-domain data into frequency-domain data by performing time-domain signal processing 502 and Fast Fourier Transform (FFT) 503 on the time-domain data.

Also, the RF unit 1000 may divide the frequency domain into a plurality of blocks having similar signal characteristics (504) and compress the frequency-domain data based on the compression parameters set in block units (505). For example, in the case of an OFDMA/SC-FDMA system, the frequency domain and the time domain may be divided and used in preset units, and a plurality of blocks into which the frequency domain and the time domain are divided may be blocks divided to have similar signal characteristics (e.g., similar average reception power or similar variance thereof). According to an embodiment, the RF unit 1000 may compress and transmit data more efficiently by configuring a plurality of blocks having similar signal characteristics in the frequency domain.

According to an embodiment, the RF unit 1000 may configure a plurality of blocks having similar signal characteristics in the frequency domain based on the scheduling information (504). For example, the RF unit 1000 may compress and transmit data more effectively by presetting a combination of compression parameters suitable for a modulation scheme or a channel coding rate and applying the set compression parameter to each of the plurality of blocks. As the RF unit 1000 configures the blocks based on the scheduling information, because it may accurately know a frequency region where a resource is allocated, it may compress the frequency-domain data more effectively. Also, based on the scheduling information, the RF unit 1000 may pre-know the frequency region where the resource is allocated and therefore may not transmit unnecessary frequency-domain data.

Also, according to an embodiment, the RF unit 1000 may predict and adjust the compression parameter to be applied to each of the plurality of blocks based on the scheduling information and the signal characteristic in each block (506). For example, the RF unit 1000 may measure the characteristic of a signal in each of the plurality of blocks and predict a compression parameter suitable for the measured signal characteristic.

According to an embodiment, the RF unit 1000 may transmit the frequency-domain data compressed in block units to the digital unit 2000 by using an interface protocol 507. In this case, the interface protocol 507 may be one of CPRI, OBSAI, and ORI but is not limited thereto.

According to an embodiment, the digital unit 2000 may expand the data received from the RF unit 1000 in block units (511). In this case, the digital unit 2000 may expand the data received from the RF unit 1000 based on the same compression parameter as the RF unit 1000. For example, the digital unit 2000 may pre-share the scheduling information and a combination of compression parameters corresponding to the scheduling information with the RF unit 1000. Also, according to an embodiment, the digital unit 2000 may divide the frequency domain and the time domain into a plurality of blocks in the same manner as the RF unit 1000 and set a portion of each of the plurality of blocks as a measurement region. The digital unit 2000 may measure the characteristic of a signal in the same measurement region as the RF unit 1000 and set a compression parameter to be applied to each of the plurality of blocks based on the measured signal characteristic. Because the digital unit 2000 and the RF unit 1000 measure the characteristics of signals in the same measurement region, the compression parameters set based on the measured signal characteristics may also be equal to each other. Accordingly, the RF unit 1000 may transmit the data compressed by applying different parameters according to blocks to the digital unit 2000 without having to additionally transmit information about the compression parameters varying according to blocks, and the digital unit 2000 may expand the data compressed by applying different parameters according to blocks.

Also, on the data expanded in block units, the digital unit 2000 may perform equalizing and demodulation (512) and perform channel decoding (513). Also, the digital unit 2000 may perform higher-layer signal processing on the decoded signal (514).

Figure 6:
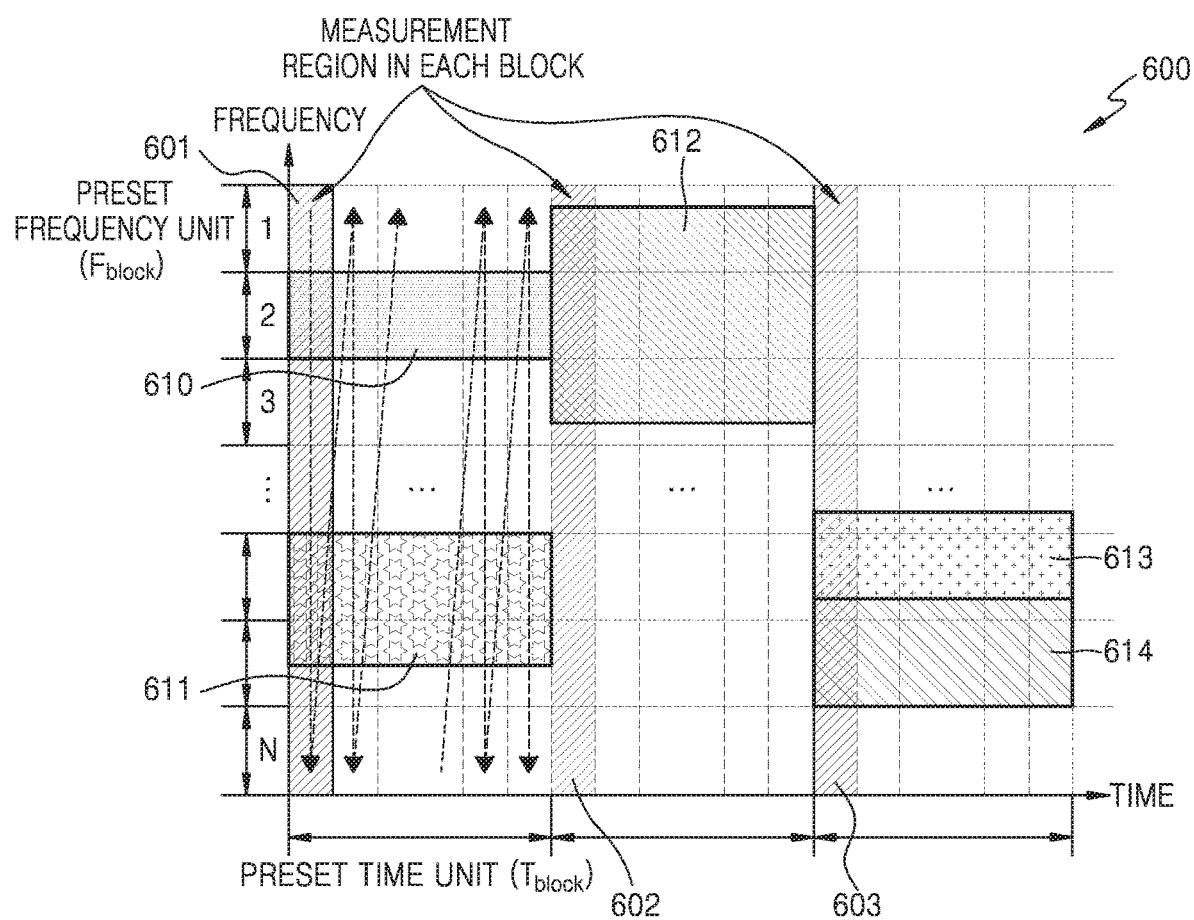
FIG. 6 is a diagram illustrating an example in which an RF unit and a digital unit divide a frequency domain and a time domain into a plurality of blocks, according to an embodiment.

FIG. 6 is a diagram illustrating an example in which an RF unit and a digital unit divide a frequency domain and a time domain into a plurality of blocks, according to an embodiment.

According to an embodiment, a resource block allocated to a particular terminal may include some bands of the frequency domain in units of preset time or OFDMA/SC-FDAM symbols. The signal characteristic such as the reception power of I/Q sample data or the variance thereof may vary according to the allocated resource blocks. Thus, in the case of compressing the I/Q sample data in the frequency domain, the I/Q sample data may be more efficiently compressed by utilizing the fact that the signal characteristic varies according to the allocated resource blocks.

Referring to FIG. 6, the RF unit 1000 and the digital unit 2000 according to an embodiment may divide a frequency domain and a time domain (600) constituting the entire resource into a plurality of blocks. Also, the RF unit 1000 and the digital unit 2000 may set some regions in each block as measurement regions 601, 602, and 603, measure the characteristic of a signal in the measurement regions 601, 602, and 603, and set a compression parameter to be applied to each block based on the measured signal characteristic.

Referring to FIG. 6, the RF unit 1000 and the digital unit 2000 may configure a plurality of blocks by dividing the frequency domain into N frequency regions each having an Fblock length and dividing the time domain into Tblock OFDM/SC-FDMA symbol units.

Also, a region including one or more blocks among the plurality of blocks may be allocated to a particular terminal. For example, a first region 610 including one block among the plurality of blocks may be allocated to a first terminal and a second region 611 including 1.5 blocks may be allocated to a second terminal; however, the present disclosure is not limited thereto. Also, the RF unit 1000 and the digital unit 2000 may set a first symbol region 601, 602, or 603 of each block as a measurement section corresponding to each block.

According to an embodiment, the RF unit 1000 and the digital unit 2000 may measure the signal characteristics in the measurement sections 601, 602, and 603 and set a compression parameter to be applied to each block based on the measured signal characteristic. Also, the RF unit 1000 and the digital unit 2000 may compress a signal corresponding to a region after the second symbol in each block based on the set compression parameter.

Figure 7:
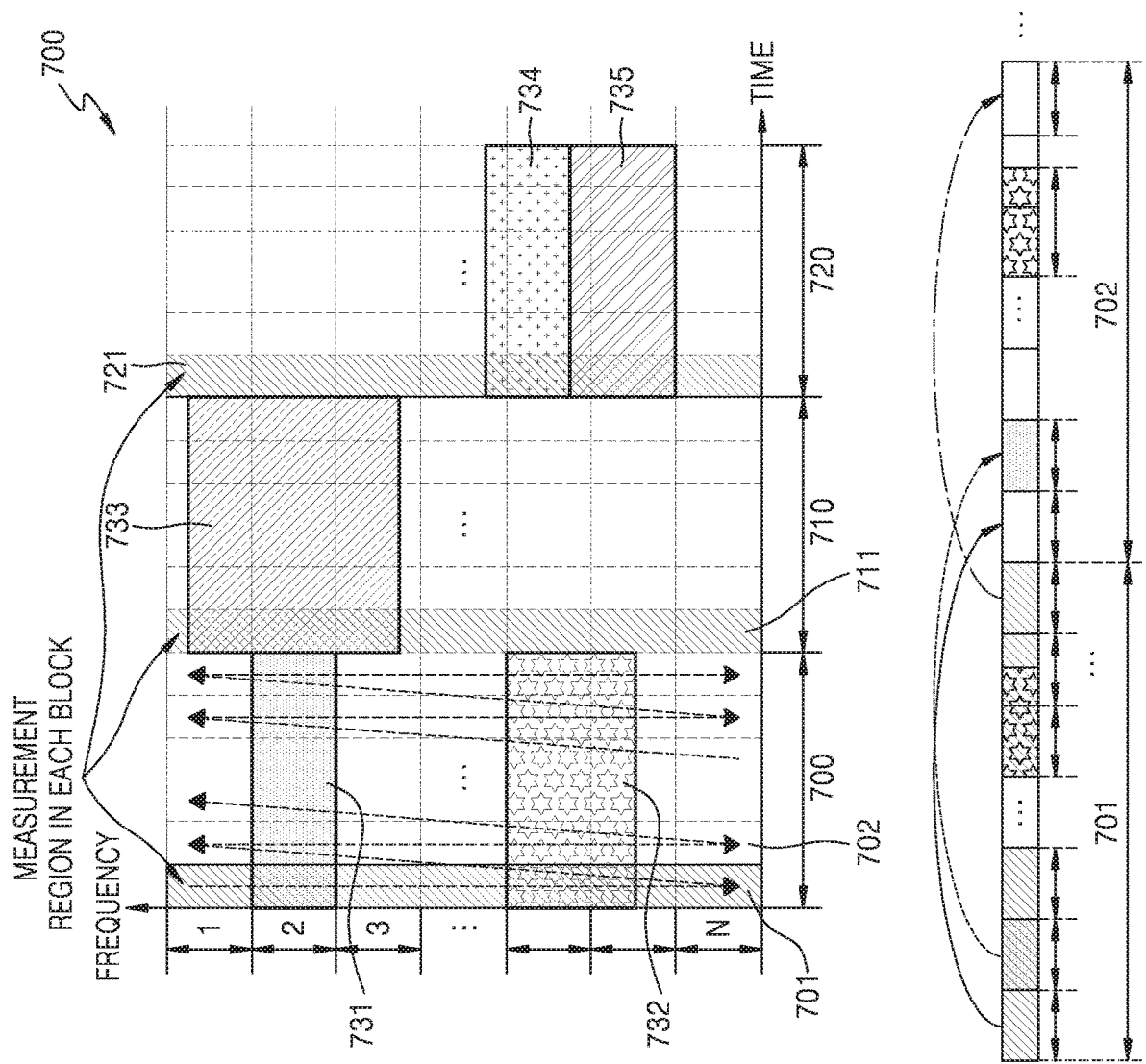
FIG. 7 is a diagram illustrating an example in which an RF unit compresses and transmits data in block units, according to an embodiment.

FIG. 7 is a diagram illustrating an example in which an RF unit compresses and transmits signals in block units, according to an embodiment.

According to an embodiment, the RF unit 1000 may perform certain signal processing on the RF signal received through an antenna and perform Fast Fourier Transform (FFT) to generate an I/Q data sequence of the frequency domain.

Referring to FIG. 7, the RF unit 1000 may set a first symbol region 701 of a first block 700 and a first symbol region 711 of a second block 710 as a measurement section and may sequentially compress the data corresponding to the measurement section. For example, the RF unit 1000 may compress data corresponding to the measurement section based on the compression parameter pre-shared with the digital unit 2000 and measure the characteristic of a signal in the measurement section. The RF unit 1000 may set a compression parameter to be applied from a second symbol region 702 of each block based on the measured signal characteristic. The RF unit 1000 may set the first symbol region 701, 711, or 721 of each block as a measurement section and measure the characteristic of a signal in the measurement section to set a compression parameter to be applied to each block. Accordingly, the compression parameter to be applied to each block may vary depending on the signal characteristics of in the first symbol region of each block.

According to an embodiment, like the RF unit 1000, the digital unit 2000 may also set the first symbol region 701, 711, or 721 of each block as a measurement region, measure the characteristic of a signal in the measurement region, and set a compression parameter to be applied from the second symbol region of each block based on the measured signal characteristic. Accordingly, the RF unit 1000 and the digital unit 2000 may equally set the compression parameter to be applied to each block without having to additionally transmit information about the compression parameters that vary according to the respective blocks.

A method of measuring the characteristic of a signal in the measurement section by the RF unit 1000 according to an embodiment may vary depending on the compression method. For example, the RF unit 1000 may compress data by using a segment-based compression method such as A-law compression or Mu-law compression. In this case, the RF unit 1000 may determine which segment of an input range the given sample data X is included in and calculate a mantissa that is a quantization operation corresponding to the corresponding segment. As a result of compressing the data, the RF unit 1000 may transmit the segment and the mantissa to the digital unit 2000, and the digital unit 200 may expand the input sample data X from the segment and the mantissa. For example, the RF unit 1000 may calculate a segment and a mantissa for the input sample data X according to Equation 1 below.

$$X(L,V) = 2^n L + V, V = X \bmod 2^n \quad \text{Equation 1}$$

In Equation 1, $L=0,1,\ldots,(2^m-1)$ may denote an m-bit segment and $V=0,1,\ldots,(2^n-1)$ may denote an n-bit mantissa. The number of segments may mean the number of sections obtained by dividing the input sample data based on a certain range, and the number of mantissas may mean the number of quantization operations in the segment. Thus, when the segment statistic calculated in the compression process are derived for some regions of the block having the same signal characteristic, the derived segment statistic may become the sample distribution of the quantized input sample data. The RF unit 1000 may obtain the maximum, average, mode, and minimum segment indexes from the segment statistic. Also, the RF unit 1000 may set the size of input I/Q sample data suitable for each block based on the segment statistic. For example, when the obtained maximum segment index is smaller than $(2^m-1)$, it may mean that the reception power of the input RF signal received by the RF unit 1000 is relatively small. Accordingly, the RF unit 1000 may convert the size of the input I/Q sample data such that the reception power may be suitable for the characteristic of the compression method.

Assuming that the number of samples in the block is Q, the number of input sample data in the measurement section is P, and the segment index of each sample is $L_i, i=1, 2, \ldots, Q$, a scaling value $I_s$ of the input sample data after the measurement section may be calculated as follows.

$$I_s = 2^{L_{target} - max\{L_i, i=1,2,\ldots,P\}} \quad \text{Equation 2}$$

In Equation 2, $L_{target}$ may be a target segment index preset according to the compression method. The RF unit 1000 may calculate data to be actually compressed by applying the scaling value $I_s$ to the input sample data. For example, the RF unit 1000 may compress the input sample data based on Equation 3 below.

$$I_0 \times \{X_1, X_2, \ldots, X_P\}, I_s \times \{X_{P+1}, X_{P+2}, \ldots, X_Q\} \quad \text{Equation 3}$$

In Equation 3, $I_0$ may be a constant preset as a scaling value of input data corresponding to the measurement section, and for example, $I_0$ may be set to 1; however, the present disclosure is not limited thereto.

According to an embodiment, the RF unit 1000 may transmit the segment and the mantissa to the digital unit 2000 as a result of compressing the data corresponding to each block. Also, according to an embodiment, the digital unit 2000 may equally estimate the scaling value $I_s$ of the input sample data used by the RF unit 1000 from the segment index $\{L_i, i=1,2,\ldots,P\}$ of the data corresponding to the measurement section of each block. For example, the digital unit 2000 may estimate the scaling value of the input sample data used by the RF unit 1000 based on Equation 4 below.

$$X_i(L_i, V_i) = \begin{cases} \dfrac{2^n L_i + V_i}{I_0}, & \text{for } i = 1, 2, \ldots, P \\ \dfrac{2^n L_i + V_i}{I_s}, & \text{for } i = P+1, P+2, \ldots, Q \end{cases} \quad \text{Equation 4}$$

Thus, the digital unit 2000 may expand the data received from the RF unit 1000 even without additionally receiving information about the $I_s$ from the RF unit 1000.

Figure 8:
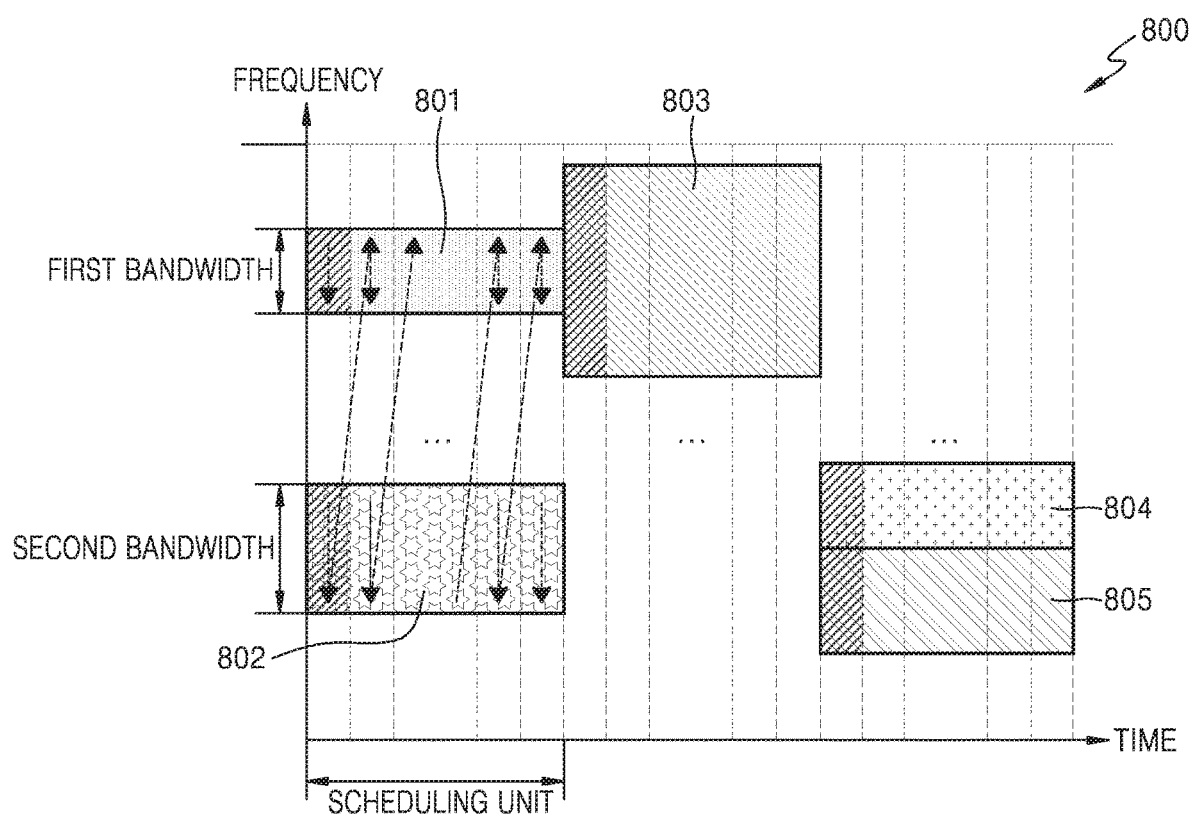
FIG. 8 is a diagram illustrating an example in which an RF unit and a digital unit divide a frequency domain and a time domain into a plurality of blocks based on scheduling information.

FIG. 8 is a diagram illustrating an example in which an RF unit and a digital unit divide a frequency domain and a time domain into a plurality of blocks based on scheduling information.

According to an embodiment, the RF unit 1000 and the digital unit 2000 may divide the frequency domain and the time domain into a plurality of blocks based on pre-shared scheduling information. Accordingly, because an unallocated region may be excluded from the plurality of blocks, the amount of data transmission between the RF unit 1000 and the digital unit 2000 may be reduced.

Referring to FIG. 8, the RF unit 1000 and the digital unit 2000 according to an embodiment may divide a frequency domain and a time domain (800) into a plurality of blocks based on the pre-shared scheduling information. For example, the RF unit 1000 may set an actually-allocated region as each of blocks 801 to 805 based on the scheduling information. In this case, because a plurality of blocks 801 to 805 are set based on the scheduling information, the frequency bandwidth may be different for each block. For example, as illustrated in FIG. 8, the frequency bandwidth of the first block 801 may be a first bandwidth and the frequency bandwidth of the second block 802 may be a second bandwidth; however, the present disclosure is not limited thereto.

Figure 9:
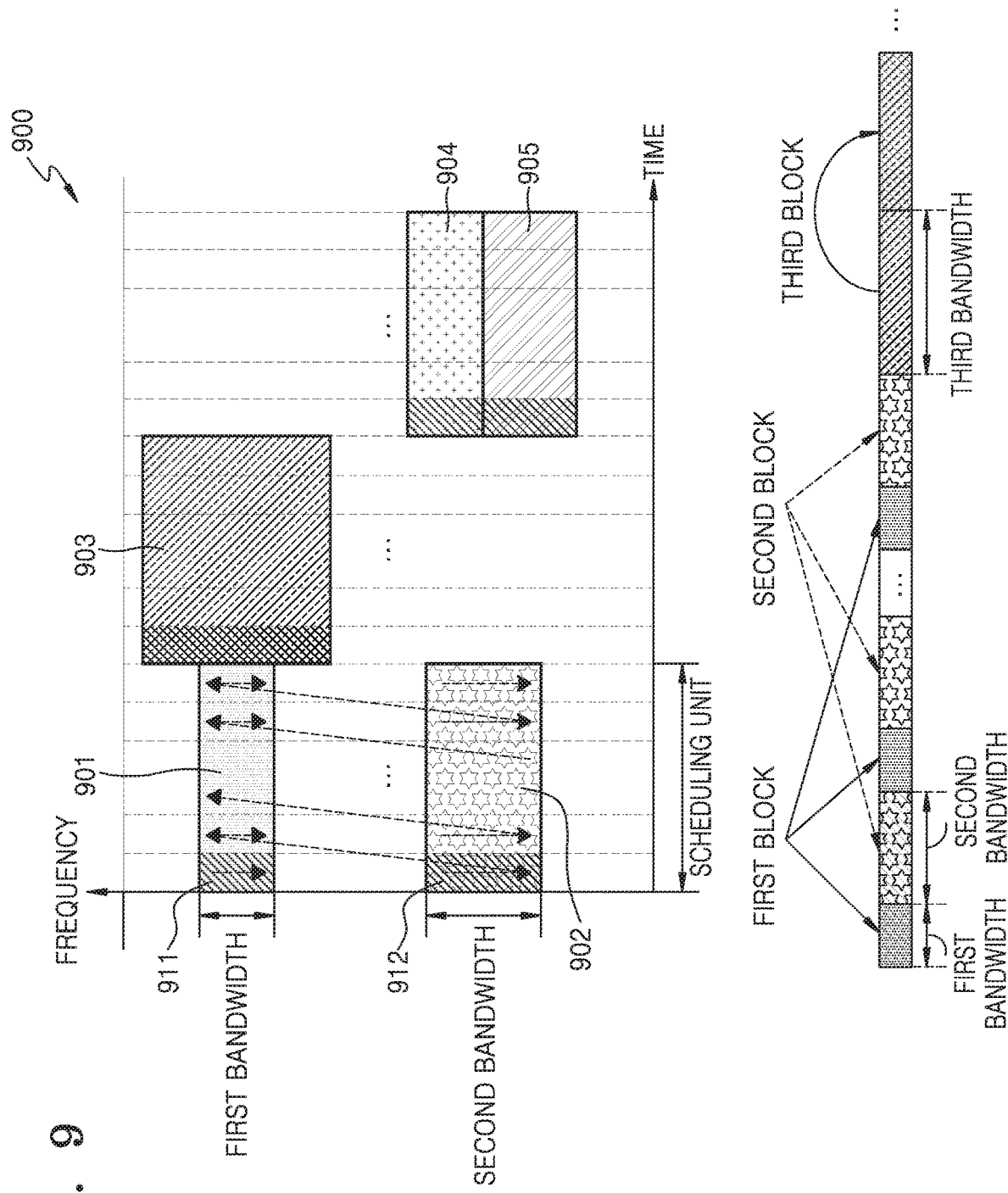
FIG. 9 is a diagram illustrating an example in which an RF unit and a digital unit compress data in block units based on scheduling information, according to an embodiment.

FIG. 9 is a diagram illustrating an example in which an RF unit and a digital unit compress data in block units based on scheduling information, according to an embodiment.

According to an embodiment, the RF unit 1000 and the digital unit 2000 may set a partial region of each block set based on the scheduling information as a measurement section and measure the characteristic of a signal in the measurement section.

Referring to FIG. 9, the RF unit 1000 and the digital unit 2000 may set a first symbol region 911 as a measurement section in a first block 901 set based on the scheduling information and set a first symbol region 912 as a measurement section in a second block 902. Also, the RF unit 1000 and the digital unit 2000 may measure the characteristic of a signal in the measurement section and set a compression parameter to be applied from the second symbol region in each of the blocks 901 to 905 by considering the measured signal characteristic.

Also, according to an embodiment, additional scheduling information such as a block modulation method or a signal characteristic may be shared between the RF unit 1000 and the digital unit 2000. In this case, the RF unit 1000 and the digital unit 2000 may not set a measurement section in each of the blocks 901 to 905 and may set a compression parameter to be applied to each of the blocks 901 to 905 based on the shared scheduling information.

FIG. 10 is a diagram illustrating a mapping relationship between additional scheduling information and compression parameters, according to an embodiment.

According to an embodiment, the RF unit 1000 and the digital unit 2000 may set a compression parameter corresponding to each block by further considering additional scheduling information. The additional scheduling information may include at least one of the modulation scheme, the operation SNR assumed by the scheduler, and the number of MIMO (Multi Input Multi Output) layers but is not limited thereto. Also, the compression parameter may include at least one of the scaling value of the input I/Q sample data, the compression ratio, and the characteristic value according to the compression method but is not limited thereto. For example, the characteristic value according to the compression method may include the Mu value of the Mu-law compression method, the A value of the A-law compression method, or the like but is not limited thereto.

According to an embodiment, the RF unit 1000 and the digital unit 2000 may preset and share additional scheduling information and a compression parameter mapped to the additional scheduling information. For example, referring to Table 1001 illustrated in FIG. 10, a compression parameter with an index of 0 may mean a compression parameter to be applied to a measurement section of each block. Also, a compression parameter with an index of 1 or more may mean a compression parameter mapped according to the additional scheduling information. In the case of the remaining section other than the measurement section in each block, the RF unit 1000 and the digital unit 2000 may select a compression parameter mapped according to the additional scheduling information and apply the selected compression parameter to compress data corresponding to the remaining section other than the measurement section in each block. For example, referring to FIG. 10, the RF unit 1000 and the digital unit 2000 may perform compression by applying a compression parameter with an index of 1 to the data corresponding to the corresponding block when a Modulation and Coding Scheme (MCS) level is less than $A_1$, a MIMO layer is $B_1$, and an operation SNR assumed by the scheduler is less than $C_1$, in the additional scheduling information about a particular block.

Figure 11:
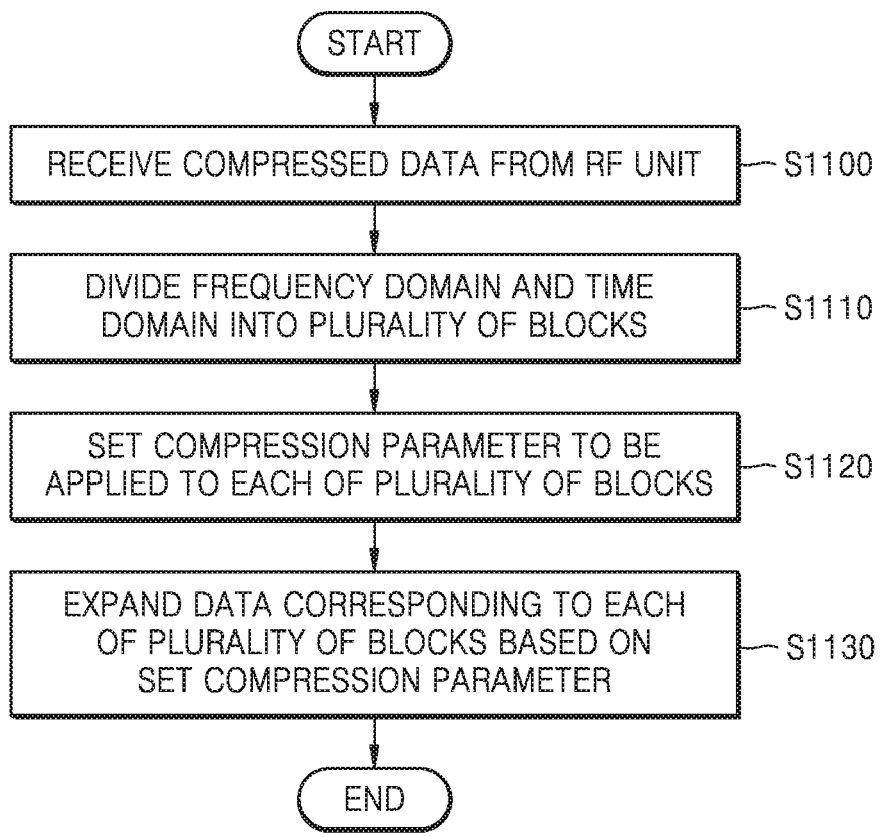
FIG. 11 is a flowchart illustrating a method of transmitting and receiving data in a wireless communication system, according to an embodiment.

FIG. 11 is a flowchart illustrating a method of transmitting and receiving data in a wireless communication system, according to an embodiment.

In operation S1100, the digital unit 2000 may receive compressed data from the RF unit 1000.

In operation S1110, the digital unit 2000 may divide a frequency domain and a time domain into a plurality of blocks. The plurality of blocks may mean blocks divided into a preset number of symbol units with respect to the time domain, and for example, the symbols may be OFDM/SC-FDMA symbols; however, the present disclosure is not limited thereto. Also, the plurality of blocks may be determined based on the scheduling information shared between the digital unit 2000 and the RF unit 1000.

In operation S1120, the digital unit 2000 may set a compression parameter to be applied to each of the plurality of blocks. The digital unit 2000 may measure the characteristic of a signal in each of the plurality of blocks and set the compression parameter to be applied to each of the plurality of blocks based on the measured signal characteristic. For example, the digital unit 2000 may set a region corresponding to a first symbol in each of the plurality of blocks as a measurement section and measure the characteristic of a signal in the measurement section.

The compression parameter to be applied to the measurement section may be a compression parameter pre-shared between the digital unit 2000 and the RF unit 1000, and the compression parameter to be applied to the remaining section other than the measurement section in each of the plurality of blocks may be set based on the measure signal characteristic.

Also, according to an embodiment, the digital unit 2000 may set the compression parameter to be applied to each of the plurality of blocks based on the scheduling information shared between the digital unit 2000 and the RF unit 1000. The scheduling information may include at least one of the allocated resource position, the bandwidth, and the scheduling period but is not limited thereto.

In operation S1130, the digital unit 2000 may expand data corresponding to each of the plurality of blocks based on the set compression parameter. For example, the data corresponding to each of the plurality of blocks may be expanded based on different compression parameters. Also, the digital unit 2000 may set the compression parameter considering the scheduling information or the signal characteristic in each of the plurality of blocks and apply different compression parameters for the data corresponding to the respective blocks. In this case, the compression parameter used by the digital unit 2000 to expand the compressed data may be the same parameter as the compression parameter used by the RF unit 1000 to compress the data corresponding to each of the plurality of blocks.

The foregoing is illustrative of embodiments of the present disclosure, and those of ordinary skill in the art will readily understand that various modifications may be made therein without materially departing from the spirit or features of the present disclosure. Therefore, it is to be understood that the embodiments described above should be considered in a descriptive sense only and not for purposes of limitation. For example, although an example of the arrangement of antennas, signal transmission lines, signal vias, and ground vias included in a single-layer circuit board has been particularly described, this is merely an example and the position or shape of each line may be variously modified.

The scope of the present disclosure is defined not by the above detailed description but by the following claims, and all modifications or differences within the scope should be construed as being included in the scope of the present disclosure.

The invention claimed is:

1. A digital apparatus comprising:
a transceiver; and
a processor coupled with the transceiver and configured to:
divide a frequency domain and a time domain into a plurality of blocks based on scheduling information shared between the digital apparatus and a radio frequency (RF) apparatus,
receive, from the RF apparatus, at least one signal in portion of each of the plurality of blocks,
set a compression parameter to be applied to each of the plurality of blocks among a plurality of compression parameters, based on a characteristic of the at least one signal, wherein the plurality of compression parameters are pre-configured between the digital apparatus and the RF apparatus, and
expand compressed data received from the RF apparatus in units of the blocks based on the set compression parameter.

2. The digital apparatus of claim 1,
wherein the plurality of blocks are blocks divided into a preset number of symbol units with respect to the time domain, and
wherein the processor is further configured to set a region corresponding to a first symbol in each of the plurality of blocks as a measurement section, and measure the signal characteristic in the measurement section.

3. The digital apparatus of claim 2, wherein the processor is further configured to expand the compressed data corresponding to the measurement section based on the set compression parameter.

4. The digital apparatus of claim 1, wherein the processor is further configured to set the compression parameter to be applied to each of the plurality of blocks, based on the scheduling information.

5. A radio frequency (RF) apparatus comprising:
a transceiver; and
a processor coupled with the transceiver and configured to:
  divide a frequency domain and a time domain into a plurality of blocks based on scheduling information shared between a digital apparatus and the RF apparatus,
  receive, from the digital apparatus, at least one signal in portion of each of the plurality of blocks,
  set a compression parameter to be applied to each of the plurality of blocks among a plurality of compression parameters, based on a characteristic of the at least one signal, wherein the plurality of compression parameters are pre-configured between the digital apparatus and the RF apparatus, and
  compress data transmitted to the digital apparatus in units of the blocks based on the set compression parameter.

6. A method, performed by a digital apparatus, of transmitting and receiving data, the method comprising:
dividing a frequency domain and a time domain into a plurality of blocks based on scheduling information shared between the digital apparatus and a radio frequency (RF) apparatus;
receiving, from the RF apparatus, at least one signal in portion of each of the plurality of blocks;
setting a compression parameter to be applied to each of the plurality of blocks among a plurality of compression parameters, based on a characteristic of the at least one signal, wherein the plurality of compression parameters are pre-configured between the digital apparatus and the RF apparatus; and
expanding compressed data received from the RF apparatus in units of the blocks based on the set compression parameter.

7. The method of claim 6,
wherein the plurality of blocks are blocks divided into a preset number of symbol units with respect to the time domain, and
wherein measuring the signal characteristic comprises:
  setting a region corresponding to a first symbol in each of the plurality of blocks as a measurement section; and
  measuring the signal characteristic in the measurement section.

8. The method of claim 7, wherein the expanding of the received data in units of the blocks comprises expanding the compressed data corresponding to the measurement section based on the set compression parameter.

9. The method of claim 7, wherein the setting of the compression parameter comprises setting the compression parameter to be applied to each of the plurality of blocks, based on the scheduling information.

10. A method, performed by a radio frequency (RF) apparatus, of transmitting and receiving data, the method comprising:
dividing a frequency domain and a time domain into a plurality of blocks based on scheduling information shared between a digital apparatus and the RF apparatus;
receiving, from the digital apparatus, at least one signal in portion of each of the plurality of blocks;
setting a compression parameter to be applied to each of the plurality of blocks among a plurality of compression parameters, based on a characteristic of the at least one signal, wherein the plurality of compression parameters are pre-configured between the digital apparatus and the RF apparatus; and
compressing
data transmitted to the digital apparatus in units of the blocks based on the set compression parameter.

* * * * *